(12) United States Patent
Ahn

(10) Patent No.: US 8,111,557 B2
(45) Date of Patent: Feb. 7, 2012

(54) NONVOLATILE MEMORY DEVICE AND METHOD OF PROGRAMMING THE DEVICE

(75) Inventor: Jung Ryul Ahn, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 119 days.

(21) Appl. No.: 12/647,586

(22) Filed: Dec. 28, 2009

(65) Prior Publication Data

US 2010/0246273 A1 Sep. 30, 2010

(30) Foreign Application Priority Data

Mar. 24, 2009 (KR) .................. 10-2009-0024926

(51) Int. Cl.
*G11C 16/06* (2006.01)
(52) U.S. Cl. .......... 365/185.22; 365/185.18; 365/189.05
(58) Field of Classification Search ............. 365/185.22, 365/185.18, 189.05
See application file for complete search history.

(56) References Cited

U.S. PATENT DOCUMENTS

2007/0115724 A1* 5/2007 Hwang .................. 365/185.17
2009/0129168 A1* 5/2009 Kim et al. ............... 365/185.19

FOREIGN PATENT DOCUMENTS

KR 1020080064063 7/2008

* cited by examiner

*Primary Examiner* — Huan Hoang
(74) *Attorney, Agent, or Firm* — IP & T Group LLP

(57) ABSTRACT

A nonvolatile memory device and a method of programming the device includes storing first data in first main and sub-registers and storing second data in second main and sub-registers, performing first program and verification operations on first memory cells based on the first data stored in the first main register, storing a result of the first verification operation in the first main register, performing a second program operation on second memory cells based on the second data stored in the second main register, changing the result of the first verification operation, stored in the first main register, into the first data stored in the first sub-register, performing an additional verification operation on the first memory cells on which the first verification operation has been completed, storing a result of the additional verification operation in the first main register, and performing a second verification operation on the second memory cells.

18 Claims, 7 Drawing Sheets

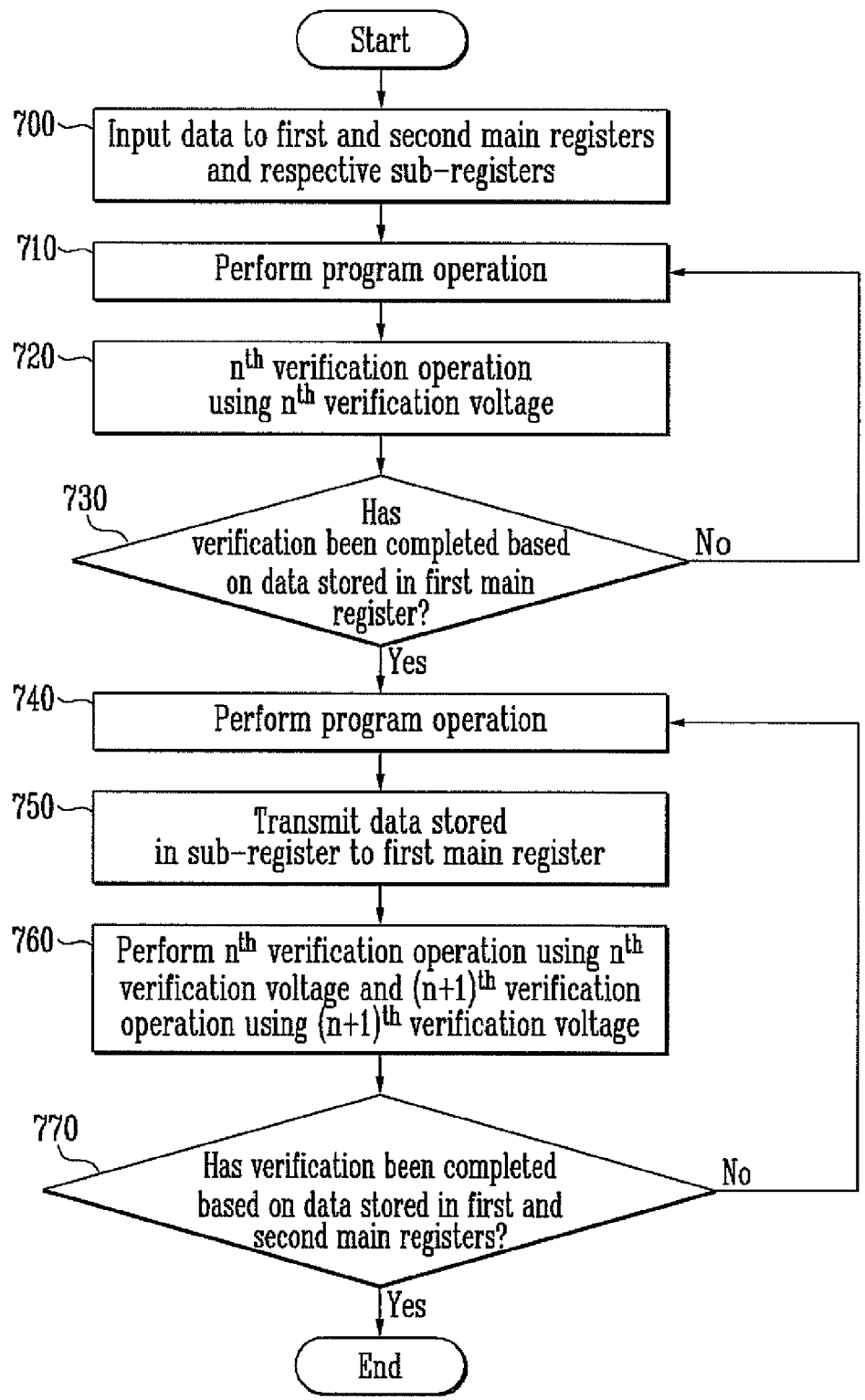

NONVOLATILE MEMORY DEVICE AND METHOD OF PROGRAMMING THE DEVICE

CROSS-REFERENCE TO RELATED APPLICATION

Priority to Korean patent application number 10-2009-0024926 filed on Mar. 24, 2009, the entire disclosure of which is incorporated by reference herein, is claimed.

BACKGROUND

One or more embodiments relate to a nonvolatile memory device and a method of programming the device.

Recently, there is an increasing demand for nonvolatile memory devices which can be electrically programmed and erased and which do not require the refresh function of rewriting data at specific intervals.

The nonvolatile memory cell of the nonvolatile memory device can be electrically programmed and erased, and the program and erase operations are performed using the threshold voltage of the cell which varies when electrons are moved by a strong electric field applied to the thin oxide layer of the cell.

The nonvolatile memory device for the most part includes a memory cell array in which memory cells for storing data are arranged in a matrix form and page buffers for writing data into respective specific memory cells of the memory cell array or for reading data stored in respective specific memory cells. The page buffers each include a pair of bit lines coupled to specific memory cells, a register configured to temporarily store data to be written into specific memory cells or to temporarily store data read from specific memory cells, a sense node configured to sense the voltage level of a specific bit line or a specific register, and a bit line selection unit configured to control whether or not to couple the specific bit line to the sensing node.

In such a program operation of the nonvolatile memory device, a bouncing phenomenon is generated in which a voltage level of the common source line is changed according to the program state of peri (peripheral) cells, which causes the level of current flowing through a specific memory cell to vary. Accordingly, an under-programmed cell is recognized as having been programmed even though the cell has not been programmed.

BRIEF SUMMARY

One or more embodiments of the present invention relate to a nonvolatile memory device capable of preventing the occurrence of under-programmed cells and a program method using the same.

A method of programming a nonvolatile memory device according to an embodiment of the present invention includes performing a first program operation on first memory cells selected to store first data, from among memory cells coupled to a selected word line, such that threshold voltages of the first memory cells each have a first target voltage corresponding to the first data, performing a first verification operation on the first memory cells using a first verification voltage, performing a second program operation on second memory cells selected to store second data, from among the memory cells coupled to the selected word line, such that threshold voltages of the second memory cells each have a second target voltage corresponding to the second data, detecting a memory cell having a threshold voltage less than the first target voltage using the first verification voltage, from among the first memory cells, performing a second verification operation for detecting a memory cell having a threshold voltage less than the second target voltage using a second verification voltage, from among the second memory cells, if a memory cell having a threshold voltage less than the first target voltage, from among the first memory cells, is detected, performing a third program operation on the memory cell such that the threshold voltage of the memory cell becomes more than the first target voltage, and if a memory cell having a threshold voltage less than the second target voltage, from among the second memory cells, is detected, performing a fourth program operation on the memory cell such that the threshold voltage of the memory cell becomes more than the second target voltage.

A method of programming a nonvolatile memory device according to another embodiment of the present invention includes storing a first data in a first main register and a first sub-register and storing a second data in a second main register and a second sub-register, performing a first program operation and a first verification operation on first memory cells based on the first data stored in the first main register, storing a result of the first verification operation in the first main register, performing a second program operation on second memory cells based on the second data stored in the second main register, changing the result of the first verification operation, stored in the first main register, into the first data stored in the first sub-register, performing an additional verification operation on the first memory cells on which the first verification operation has been completed, storing a result of the additional verification operation in the first main register, and performing a second verification operation on the second memory cells.

In the above embodiments, if, as a result of the first verification operation, threshold voltages of the first memory cells are determined to be less than a target voltage, a program voltage is raised, and the first program operation is further performed.

In the above embodiments, the additional verification operation is performed only when threshold voltages of the first memory cells are determined to be more than a target voltage as a result of the first verification operation.

In the above embodiments, the additional verification operation is performed after the second program operation is performed.

In the above embodiments, if, as a result of the additional verification operation, threshold voltages of the first memory cells are determined to be less than a target voltage, the first program operation is further performed on the first memory cells.

In the above embodiments, during the additional verification operation, a first verification voltage is applied to the first memory cells. During the second verification operation, a second verification voltage raised from the first verification voltage is applied to the second memory cells.

In the above embodiments, during the additional verification operation, a first verification voltage is supplied to the first memory cells. After the supply of the first verification voltage is stopped, a second verification voltage higher than the first verification voltage is applied to the second memory cells during the second verification operation.

In the above embodiments, if, as a result of the second verification operation, threshold voltages of the second memory cells are determined to be less than a target voltage, a program voltage is raised, and the second program operation is further performed.

A nonvolatile memory device according to an embodiment of the present invention includes main registers each configured to store input data before a program operation and to store a result of a verification operation instead of the input data when the verification operation is performed, sub-latch units each configured to store the input data during the program operation and the verification operation, and latch coupling units each configured to transfer the input data, stored in the sub-latch unit, to the main register if, as a result of the verification operation, threshold voltages of memory cells are determined to be more than a target voltage.

The latch coupling unit functions to prevent the result of the verification operation from being transferred to the sub-latch unit such that the sub-latch unit maintains the input data during the verification operation.

The nonvolatile memory device further comprises latch reset units each configured to reset the sub-latch unit.

When data are inputted, the latch coupling unit is driven, and data having a same logic level are stored in the main latch unit and the sub-latch unit.

BRIEF DESCRIPTION OF THE DRAWINGS

FIG. 7 is a flowchart illustrating a verification method in the nonvolatile memory device according to an embodiment of the present invention.

DESCRIPTION OF EMBODIMENTS

Figure 1:
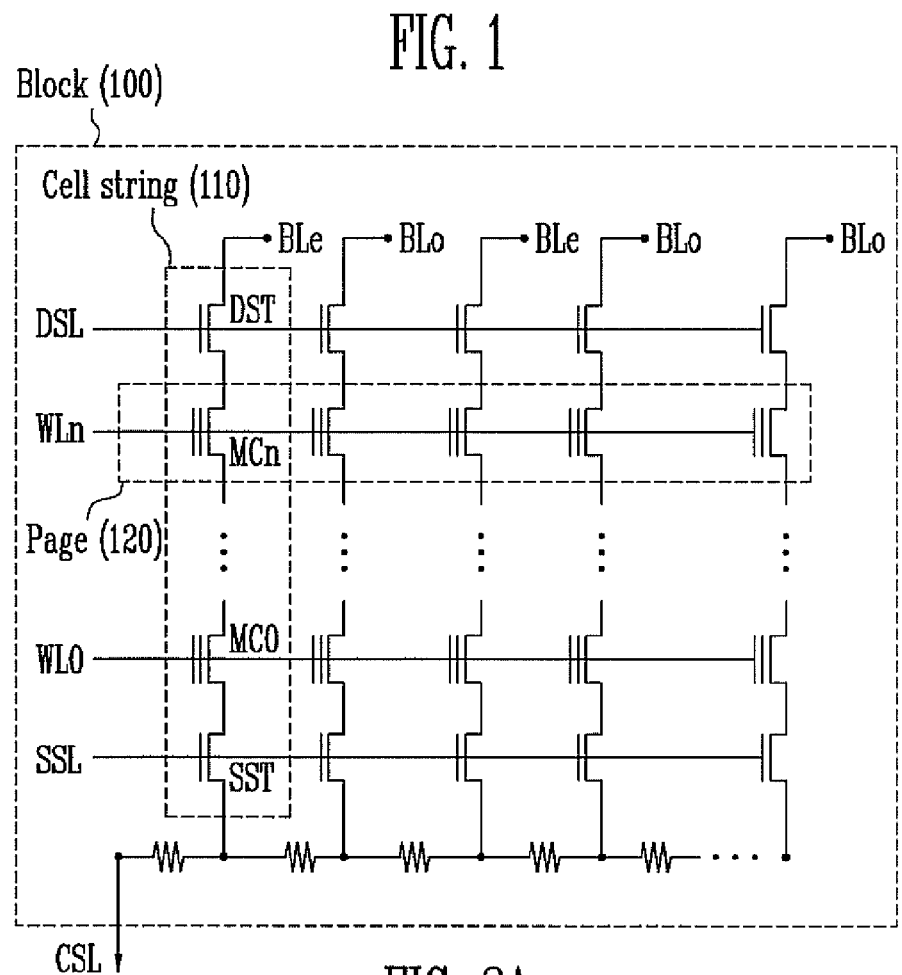
FIG. 1 is a diagram showing the structure of a memory cell array of a nonvolatile memory device.

Hereinafter, some embodiments of the present invention are described in detail with reference to the accompanying drawings. The drawing figures have been provided to allow those having ordinary skill in the art to understand the scope of the embodiments of the present invention.

FIG. 1 is a diagram showing the structure of a memory cell array of a nonvolatile memory device.

The memory cell array block 100 includes memory cells MC0 to MCn configured to store data, word lines WL0, WL1, . . . , WLn configured to select and enable the memory cells, and bit lines BLe, BLo configured to input and output data of the memory cells. The memory cell array 100 has a structure in which the plurality of word lines and the plurality of bit lines are arranged in a matrix form. The memory cell array 100 includes drain select transistors DST coupled between the bit lines and the memory cells and source select transistors SST coupled between the memory cells and a common source line CSL.

A group of the memory cells coupled in series between the source select transistor SST and the drain select transistor DST is called a cell string 110. The gates of the memory cells are coupled to the word lines. A group of the memory cells in common coupled to the same word line is called a page 120. The plurality of cell strings coupled to the respective bit lines are coupled in parallel with the common source line CSL, thus forming the memory block 100.

Meanwhile, the cell strings 120 are coupled in parallel with the common source line CSL. Each of the common source lines coupled with the cell strings is coupled with a metal bypass line (not shown) that is parallel to a bit line. Here, the common source line is an n+ diffused source line, and it includes resistance components. Noise is generated because of a high resistance of the common source line, which has an effect on control of the threshold voltage. Problems resulting from the resistance of the common source line are described below in more detail.

Figure 2A:
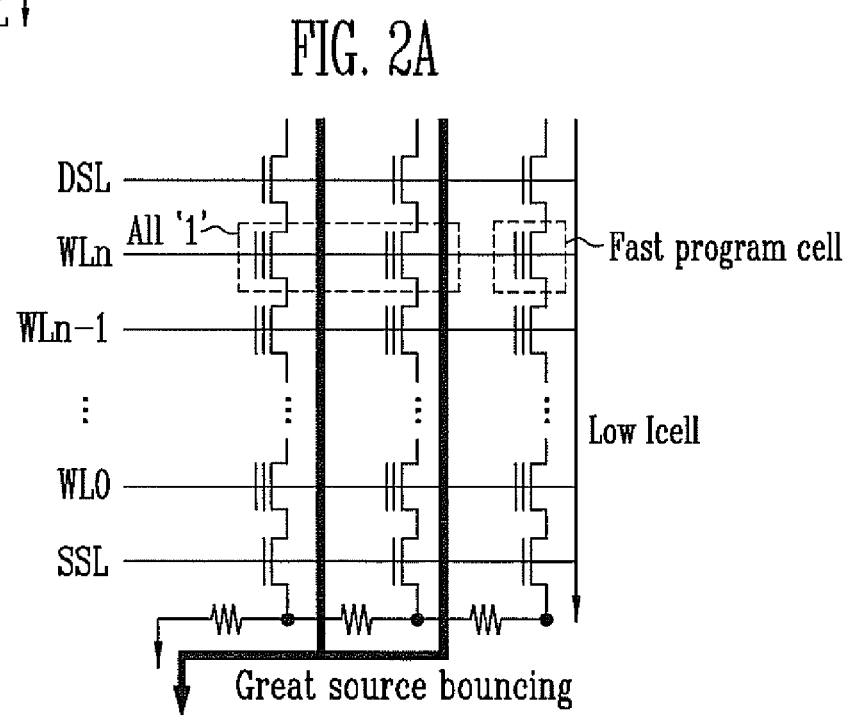
FIGS. 2A and 2B are diagrams showing a bouncing phenomenon of a common source line resulting from resistance components of the common source line.
Figure 2B:
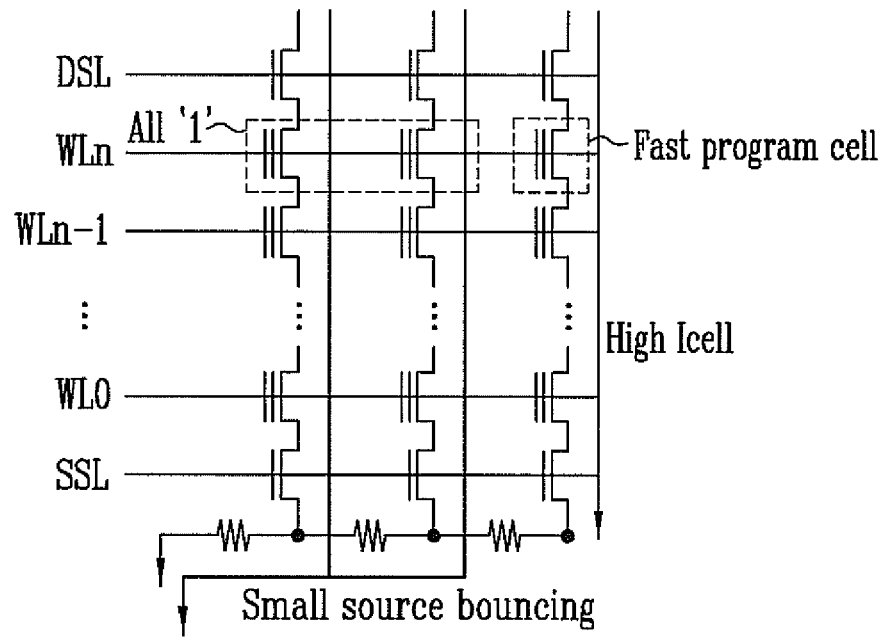

FIGS. 2A and 2B are diagrams showing the bouncing phenomenon of the common source line resulting from the resistance components of the common source line.

It is assumed that the page of a selected word line is programmed. In FIG. 2A, the page of the selected word line includes both cells which are first programmed (i.e., fast program cells) and slow program cells which are target program cells in the same word line, but are not programmed.

In a known verification operation, in the state in which a bit line is precharged to a high level, a determination is made as to whether a program operation has been completed by checking whether a voltage level of the bit line has changed according to the state of a cell. That is, if, as a result of the determination, the program operation is determined to have been completed, the bit line maintains the high level. If the program operation is determined not to have been completed, the voltage of the bit line is discharged through the common source line. In the case of the slow program cells (all indicated by a state "1"), the voltage levels of the slow program cells are discharged from a precharge level to a ground voltage because the slow program cells have not been programmed. Here, the voltage of the common source line rises and source voltages of the fast program cells also rise because of the resistance of the common source line. Consequently, a sense current Icell of the fast program cells is decreased because of noise occurring in the common source line.

Even though the threshold voltages of the fast program cells are less than a verification voltage, the fast program cells are a pass for a verification operation because of the decreased current. Thus, the fast program cells are determined as having been programmed, and so a program operation is no longer performed on them.

FIG. 2B is a diagram showing a situation in which all slow program cells have been programmed and so noise of the common source line has reduced. If a read operation is performed in this state, the noise of the common source line is reduced, a bouncing phenomenon disappears, and current flowing through the fast program cells rises higher than a verification operation. Accordingly, the threshold voltages of the fast program cells are read as being less than a read voltage.

As described above, the bouncing phenomenon is generated in which a voltage level of the common source line is changed according to the program state of peri cells, which causes the level of current flowing through a specific memory cell to vary. Accordingly, an under-programmed cell is recognized as having been programmed even though the cell has not been programmed.

Figure 3:
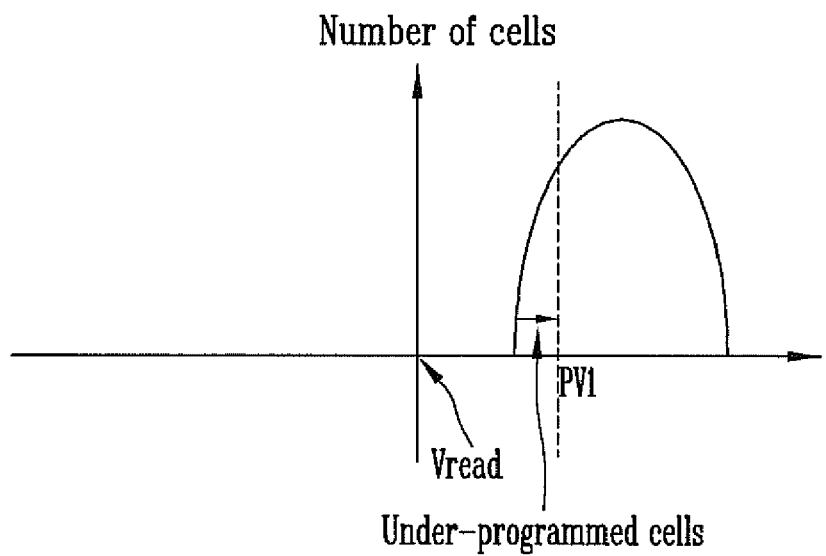
FIG. 3 is a graph showing an under-program phenomenon occurring in a nonvolatile memory device.

FIG. 3 is a graph showing an under-program phenomenon occurring in a nonvolatile memory device.

As shown in FIG. 3, although some cells have not been programmed to have higher than a first verification voltage PV1, the cells are read as having been programmed because of the above regions. Accordingly, a read margin corresponding to a difference between the first verification voltage PV1 and a read voltage Vread is reduced. In a multi-level cell (MLC) program method, such a phenomenon may become a fatal problem. Since cells have two or more threshold voltage distributions in such an MLC program method, a read margin for each threshold voltage distribution has to be secured.

Accordingly, in the present invention, an attempt is made to solve such an under-program problem due to the bouncing phenomenon of the common source line.

FIGS. 4A to 4D are diagrams showing the concept of an MLC program method of a nonvolatile memory device which is applied to the present invention.

Figure 4B:
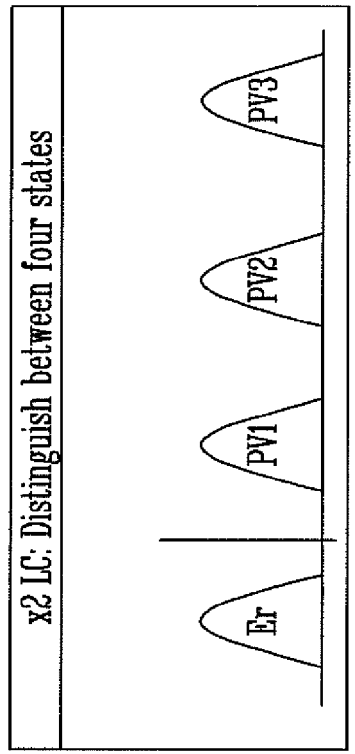
FIGS. 4A to 4D are diagrams showing the concept of an MLC program method of a nonvolatile memory device which is applied to embodiments of the present invention.
Figure 4D:
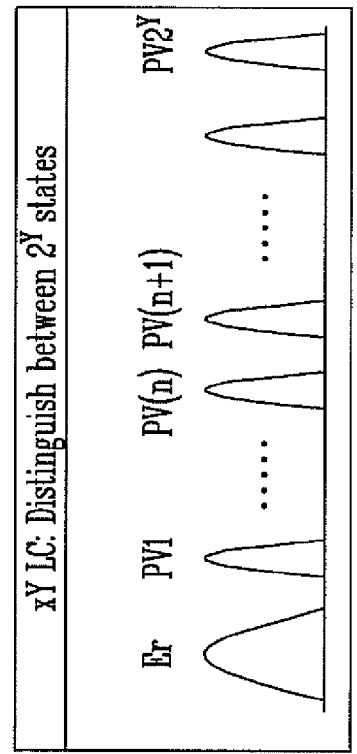
Figure 4A:
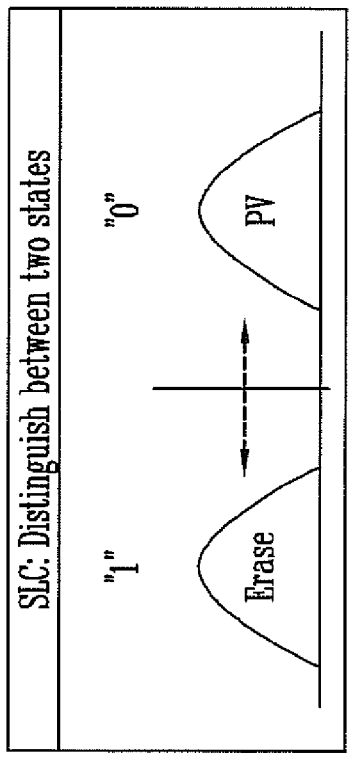
Figure 4C:
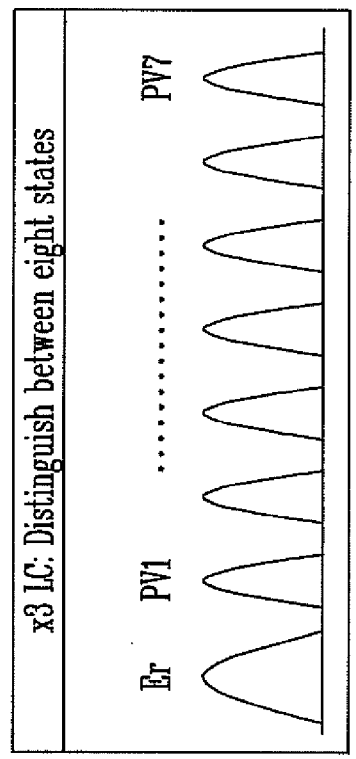

First, FIG. 4A relates to a single level cell (SLC) program method and shows two different threshold voltage states. Accordingly, it is considered that data of 1 bit are stored in one cell. FIG. 4B relates to a 2-bit MLC program method and shows four different threshold voltage states. Accordingly, it is considered that data of two bits are stored in one cell. FIG. 4C relates to a 3-bit MLC program method and shows eight different threshold voltage states. Accordingly, it is considered that data of 3 bits are stored in one cell. FIG. 4D relates to a Y-bit MLC program method and shows a $2^Y$ number of different threshold voltage states. Accordingly, it is considered that data of Y bits are stored in one cell.

In the present invention, an attempt is made to minimize the number of under-programmed cells. To this end, under-programmed cells are detected by repeatedly performing a verification operation such that a program operation can be performed.

Figure 5A:
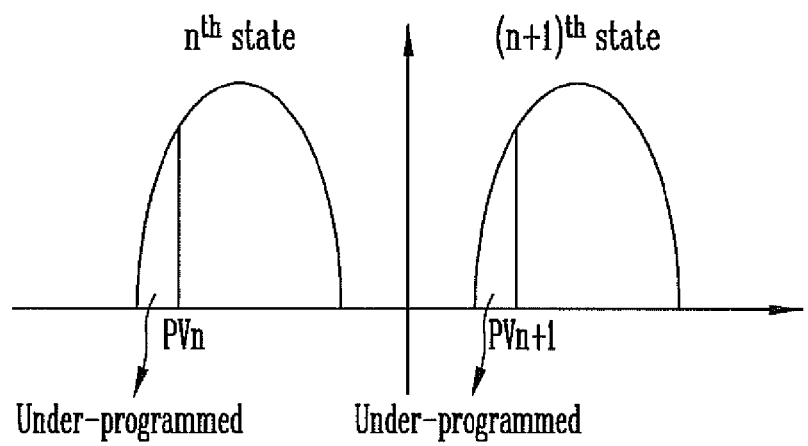
FIGS. 5A and 5B are diagrams showing a verification method in a nonvolatile memory device according to an embodiment of the present invention.
Figure 5B:
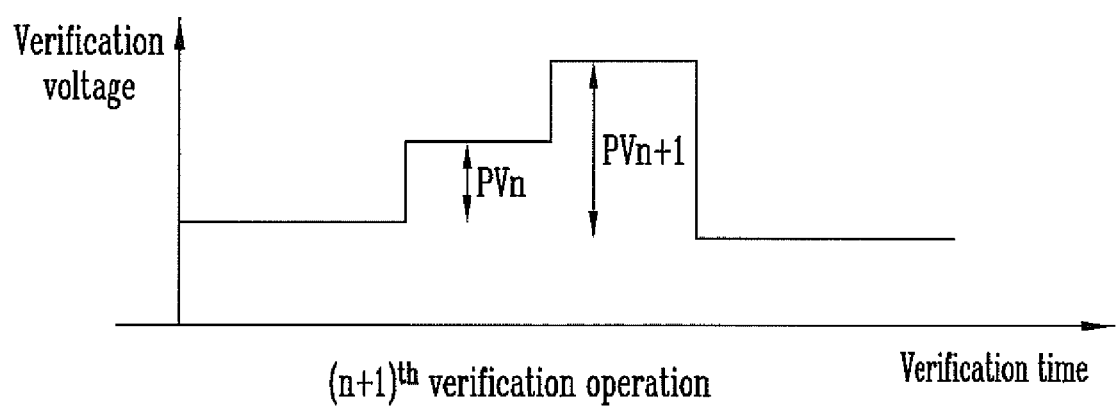

FIGS. 5A and 5B are diagrams showing a verification method in a nonvolatile memory device according to an embodiment of the present invention.

It is first assumed that cells each of which will be programmed to have a threshold voltage more than an $n^{th}$ verification voltage PVn (i.e., a first target voltage), but less than an $(n+1)^{th}$ verification voltage PVn+1 (i.e., a second target voltage) are called $n^{th}$ target program cells, and cells each of which will be programmed to have a threshold voltage more than the $(n+1)^{th}$ verification voltage PVn+1, but less than an $(n+2)^{th}$ verification voltage PVn+2 are called $(n+1)^{th}$ target program cells.

It is also assumed that cells each having a threshold voltage more than the $n^{th}$ verification voltage PVn, from among the $n^{th}$ target program cells, are called cells of an $n^{th}$ state, and cells each having a threshold voltage more than the $(n+1)^{th}$ verification voltage PVn+1, from among the $(n+1)^{th}$ target program cells, are called cells of an $(n+1)^{th}$ state.

In the present invention, when a verification operation is performed on the $(n+1)^{th}$ target program cells, a verification operation is performed on the $n^{th}$ target program cells. In other words, after a verification operation is performed on the $n^{th}$ target program cells, the verification operation is performed on the $n^{th}$ target program cells when the verification operation is performed on the $(n+1)^{th}$ target program cells. To this end, the $n^{th}$ verification voltage PVn and the $(n+1)^{th}$ verification voltage PVn+1 are stepwise consecutively applied to a word line of target verification cells.

A circuit for implementing such a method is described below.

Figure 6:
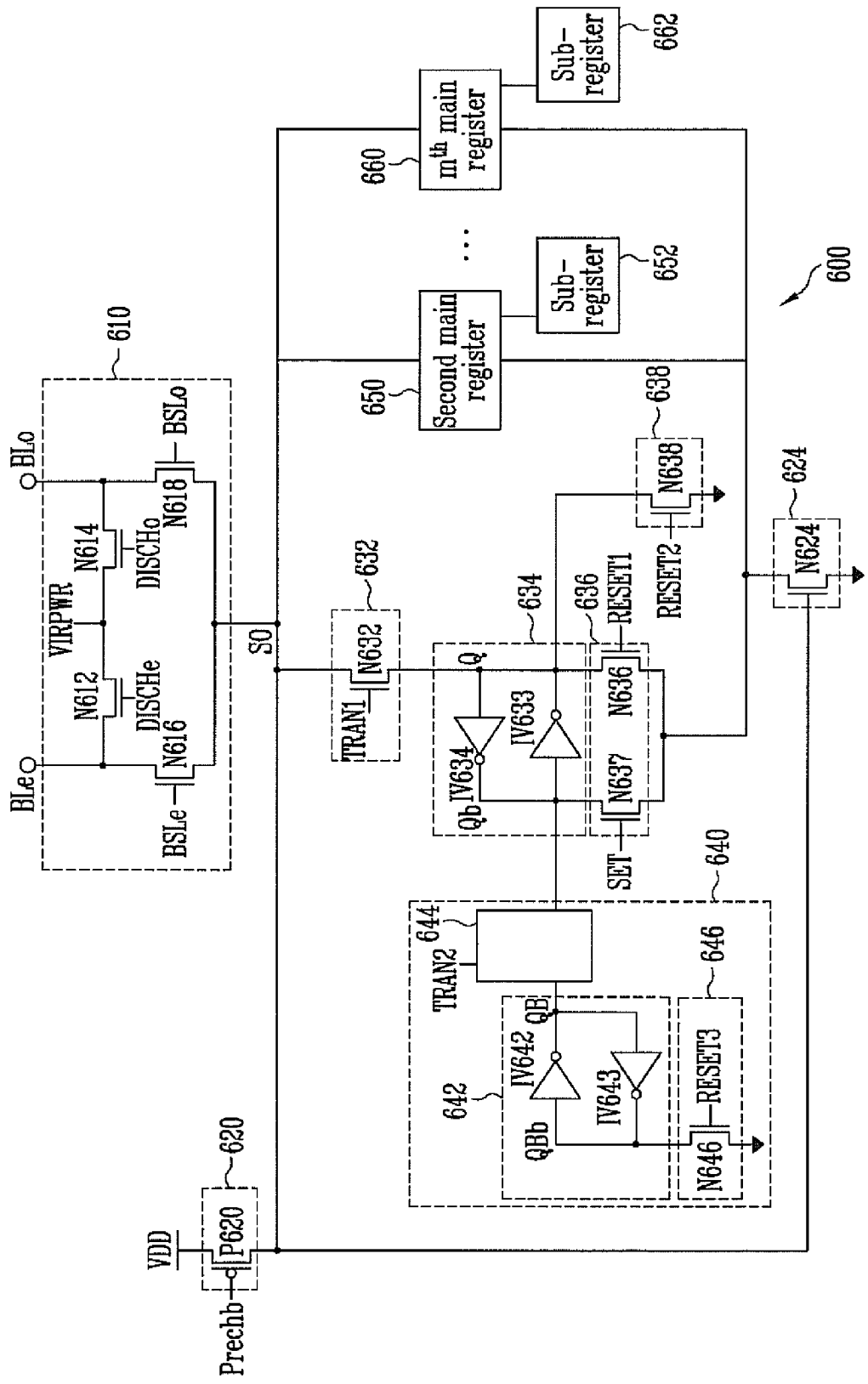
FIG. 6 is a circuit diagram showing the page buffer of a nonvolatile memory device according to an embodiment of the present invention.

FIG. 6 is a circuit diagram showing the page buffer of a nonvolatile memory device according to an embodiment of the present invention.

The page buffer 600 includes a bit line selection unit 610, a sense node precharge unit 620, first to $n^{th}$ main registers 650 to 660, a sense node sense unit 624, and sub-registers 640, 652 to 662. The bit line selection unit 610 is configured to selectively couple bit lines BLe and BLo, coupled to specific memory cells, with a sense node SO. The sense node precharge unit 620 is configured to supply the sense node SO with a power supply voltage VDD of a high level. The first to $n^{th}$ main registers 650 to 660 are configured to temporarily store data to be programmed into specific memory cells or to temporarily store data read from specific memory cells. The sense node sense unit 624 is configured to supply a ground voltage to each of the registers according to a voltage level of the sense node SO. The sub-registers 640, 652 to 662 are configured to redundantly store data stored in respective main registers.

The bit line selection unit 610 includes an NMOS transistor N616 and an NMOS transistor N618. The NMOS transistor N616 is configured to couple the even bit line BLe and the sense node SO together in response to a first bit line selection signal BSLe. The NMOS transistor N618 is configured to couple the odd bit line BLo and the sense node SO together in response to a second bit line selection signal BSLo.

The bit line selection unit 610 further includes a variable voltage input terminal VIRPWR, an NMOS transistor N612, and an NMOS transistor N614. The variable voltage input terminal VIRPWR is configured to supply a variable voltage VIRPWR of a specific level. The NMOS transistor N612 is configured to couple the even bit line BLe and the variable voltage input terminal VIRPWR together in response to a first discharge signal DISCHe. The NMOS transistor N614 is configured to couple the odd bit line BLo and the variable voltage input terminal VIRPWR together in response to a second discharge signal DISCHo.

The sense node precharge unit 620 is configured to apply the voltage VDD of a high level to the sense node SO in response to a precharge signal Prechb. To this end, the sense node precharge unit 620 includes a PMOS transistor P620 coupled between the power supply voltage terminal VDD and the sense node SO. Accordingly, the PMOS transistor P620 supplies the power supply voltage VDD of a high level to the sense node SO in response to the precharge signal Prechb of a low level.

Elements 632, 634, 636, and 638 constitute a first main register. The first main register includes a data latch unit 634 configured to store data, a data set unit 636 configured to store data to be stored in the data latch unit 634, a data transmission unit 632 configured to send data stored in the data latch unit 634 to the sense node SO, and a latch reset unit 638 configured to reset the data latch unit 634.

The data latch unit 634 is configured to temporarily store data to be programmed into selected cells or to temporarily store data read from selected cells. To this end, the output terminal of a first inverter IV634 is coupled to the input terminal of a second inverter IV633, and the output terminal of the second inverter IV633 is coupled to the input terminal of the first inverter IV634. Here, a node where the output terminal of the second inverter IV633 is coupled to the input terminal of the first inverter IV634 is called a first node Q, and a node where the output terminal of the first inverter IV634 is coupled to the input terminal of the second inverter IV633 is called a second node Qb.

For example, when data of a high level are supplied to the first node Q, the corresponding data are inverted by the second inverter IV633, and so data of a low level are supplied to the second node Qb. The data of a low level are inverted by the first inverter IV634 again, and the data of a high level supplied to the first node Q remains intact. Accordingly, a data storage effect is generated. On the contrary, when data of a low level are supplied to the first node Q, the corresponding data are inverted by the second inverter IV633, and so data of a high level are supplied to the second node Qb. The data of a high level are inverted by the first inverter IV634 again, and the data of a low level supplied to the first node Q remains intact. Accordingly, a data storage effect is generated.

The data set unit 636 includes a first data setting transistor N636 configured to supply the ground voltage to the first node Q to the data latch unit 634 and a second data setting transistor N637 configured to supply the ground voltage to the second node Qb.

The first data setting transistor N636 is coupled between the sense node sense unit 624 and the first node Q and is configured to supply the first node Q with the ground voltage, received from the sense node sense unit 624, in response to a first data set signal RESET1.

Furthermore, the second data setting transistor N637 is coupled between the sense node sense unit 624 and the second node Qb and is configured to supply the second node Qb with the ground voltage, received from the sense node sense unit 624, in response to a second data set signal SET.

The data transmission unit 632 is configured to selectively supply the sense node with data stored in the first node Q of the data latch unit 634. To this end, the data transmission unit 632 includes a data transmission transistor N632 configured to selectively couple the first node Q and the sense node SO together in response to a transmission signal TRAN1.

The latch reset unit 638 is configured to supply the ground voltage to the first node Q of the data latch unit 634 in response to a reset signal RESET2. Accordingly, data stored in the first node Q are all reset to '0'.

The sense node sense unit 624 is configured to supply the data set unit 636 with the ground voltage according to a voltage level of the sense node SO. To this end, the sense node sense unit 624 includes an NMOS transistor N624 coupled between the data set unit 636 and the ground terminal.

Accordingly, a ground voltage is supplied to the data set unit 636 according to a voltage level of the sense node SO. When the voltage level of the sense node SO is at a high level, the sense node sense unit 624 supplies the ground voltage to the data set unit 636. Here, when the first data set signal RESET1 of a high level is inputted, the ground voltage is supplied to the first node Q, which is recognized as having data of a low level supplied to the first node Q. However, when the second data set signal SET of a high level is supplied, the ground voltage is supplied to the second node Qb, which is recognized as having data of a high level supplied to the first node Q.

The sub-registers 640, and 652 to 662 each are configured to redundantly store data stored in the data latch unit 634 of the main register. The data latch unit 634 is configured to store data according to a data input circuit (not shown). Here, the same data as that stored in the data latch unit 634 are stored in each of the sub-registers 640, and 652 to 662 such that the same data are supplied to the sub-register 640.

To this end, the sub-register 640 includes a sub-latch unit 642 configured to store data, a latch coupling unit 644 configured to selectively couple the sub-latch unit 642 and the data latch unit 634 of the first register 630, and a latch reset unit 646 configured to reset the sub-latch unit 642.

In the sub-latch unit 642, as in the data latch unit 634, the output terminal of a first inverter IV642 is coupled to the input terminal of a second inverter IV643, and the output terminal of the second inverter IV643 is coupled to the input terminal of the first inverter IV642. Here, a node where the output terminal of the first inverter IV642 is coupled to the input terminal of the second inverter IV643 is called a first node QB, and a node where the output terminal of the second inverter IV643 is coupled to the input terminal of the first inverter IV642 is called a second node QBb.

The latch coupling unit 644 is configured to electrically couple the latch units 634 and 642 together such that data of the data latch unit 634 are transferred to the sub-latch unit 642 or data of the sub-latch unit 642 are transferred to the data latch unit 634 in response to a data transmission signal TRAN2. When the latch coupling unit 644 is operated, the same data are outputted to the first node Q of the data latch unit 634 and the first node QB of the sub-latch unit 642. That is, when data '0' are outputted to the first node Q, data '0' are outputted to the first node QB. The latch coupling unit 644 can be implemented using buffers configured to transfer data in one direction.

Here, when data are inputted, the latch coupling unit 644 is driven, and so the same data are stored in the first main register and the sub-register. Next, when a verification operation is performed, the driving of the latch coupling unit 644 is blocked, and only the data of the first main register are changed. That is, data inputted when the data are initially inputted remain intact in the sub-register 640.

The latch reset unit 646 includes an NMOS transistor N646 configured to selectively ground the second node QBb of the sub-latch unit 642 in responses to a reset signal RESET3. Accordingly, the ground voltage is supplied to the second node QBb of the sub-latch unit 642.

The page buffer further includes a plurality of registers for the purpose of an MLC program operation. The main registers 650 and 660 each have almost the same construction as the first main register (including 632, 634, 636, and 638). In the MLC program operation, the number of registers may differ according to the number of bits, and the constructions of the registers may slightly differ. Furthermore, the sub-registers 652 to 662 may be coupled to their respective main registers.

FIG. 7 is a flowchart illustrating a verification method in the nonvolatile memory device according to an embodiment of the present invention.

First, a program operation is performed on first memory cells selected to store first data (hereinafter referred to as '$n^{th}$ target program cells'), from among memory cells coupled with a selected word line, such that the threshold voltages of the $n^{th}$ target program cells are more than a first target voltage corresponding to the first data. Next, a first verification operation (hereinafter referred to as an '$n^{th}$ verification operation') using a first verification voltage (hereinafter referred to as an '$n^{th}$ verification voltage') is then performed on the program operation at steps 700, 710, 720, and 730.

In more detail, the first and second data are respectively inputted to the first and second main registers and the sub-registers of the respective main registers at step 700.

Here, the first data to be stored in the $n^{th}$ target program cells are inputted to the first main register, and the second data to be stored in the $(n+1)^{th}$ target program cells are inputted to the second main register. The data stored in the first and second main registers are identical with that stored in the sub-registers of the respective first and second main registers. In this case, data stored in known registers, such as the first and second main registers, are changed according to a verification operation, but data stored in the sub-registers are retained irrespective of the verification operation. In the case of the target program cells, data '0' is outputted to the first nodes Q and QB of the latch units included in the registers. In the case of program-inhibited cells, data '1' is outputted to the first nodes Q and QB of the latch units.

When the verification operation is performed, data of the main registers are changed according to a state of the target program cells, which will be described in more detail later. However, the sub-registers maintain their initial data.

Next, a program operation is performed on the $n^{th}$ target program cells at step 710.

The program operation is performed using a known incremental step pulse program (ISPP) method. That is, after applying a program pulse while repeatedly applying the program pulse, a verification operation is performed. Whenever the program pulse is applied, a program pulse voltage is increased by a step voltage. Meanwhile, in the case of the target program cells, data '0' is outputted to the first node Q, and in the case of program-inhibited cells, data '1' is outputted to the first node Q. Accordingly, a channel voltage of the target program cells maintains a low level, thereby generating FN tunneling according to the application of the program voltage. Accordingly, the threshold voltages of the target program cells rise.

Next, the $n^{th}$ verification operation is performed by applying the $n^{th}$ verification voltage to a word line coupled to the target verification cells at step 720.

The verification operation is performed using a known verification method. First, a bit line coupled to a cell string, including the target verification cells, is precharged to a high level. Next, the $n^{th}$ verification voltage is supplied to the word line coupled to the target verification cells, and a pass voltage Vpass is supplied to word lines coupled to the remaining cells. The pass voltage Vpass is enough to turn on all corresponding cells respectively of the threshold voltage of each cell, and so the remaining memory cells are in a turned-on state. Thus, a voltage level of the bit line is determined according to the threshold voltages of the target verification cells. That is, if the threshold voltages of the target verification cells are more than the $n^{th}$ verification voltage (i.e., the first target voltage), the corresponding cells maintain a turned-off state, and so the voltage level of a bit line coupled to the corresponding cells maintains a high level. However, if the threshold voltages of the target verification cells are less than the $n^{th}$ verification voltage, the corresponding cells are turned on, and so a voltage level of the bit line is discharged to a low level via the cell string. A change in the voltage level of the bit line as described above is transferred to the sense node, and a voltage level of the sense node is sensed and stored in the data latch unit.

In a typical case, when the target verification cells are programmed to have threshold voltages more than a verification voltage, the sense node SO maintains a high level. Thus, the sense node sense unit 624 is driven, and so data '1' (i.e., program completion data) is stored in the first node Q. However, if the target verification cells are programmed to have threshold voltages less than the verification voltage, the sense node SO has a low level. Thus, the sense node sense unit 624 is not driven, and so data initially stored in the first node Q remains intact.

Typically, in the case of target program cells, since data '0' is outputted to the first node Q, data '0' stored in the first node Q remains intact. Meanwhile, in the case of program-inhibited cells, data '1' is initially stored in the first node Q. Accordingly, if data '1' is outputted to the first node Q, corresponding cells are determined to be program-inhibited cells or cells programmed to have threshold voltages more than a verification voltage. Accordingly, a program voltage is no longer supplied to the corresponding cells. Furthermore, if data '1' is outputted to the first node Q, corresponding cells are determined to be target program cells, but a program operation for the target program cells has not been completed. Accordingly, a program voltage has to be repeatedly supplied to the target program cells.

As described above, under-programmed cells may be determined to have been programmed with threshold voltages more than a verification voltage even though they have not been programmed to have threshold voltages more than the verification voltage, and so the data '0' outputted to the first node Q can be changed into data '1' as a result of the verification operation. That is, the data '1' is outputted to the first node Q of the under-programmed cells as well as cells that have normally been programmed to have threshold voltages more than the verification voltage during the $n^{th}$ verification operation.

During the verification operation, the latch coupling unit 644 of the sub-latch unit 640 is turned off. Accordingly, although the data of the data latch unit 634 are changed, the data of the sub-latch unit 642 remain intact.

A determination is then made as to whether all of the $n^{th}$ target program cells have been programmed to have threshold voltages more than the $n^{th}$ verification voltage based on the data stored in the first main register at step 730.

Information about the $n^{th}$ target program cells is stored in the data latch unit of the first main register. If the data of the first nodes are all outputted as data '1', it is determined that the $n^{th}$ target program cells have all been programmed to have threshold voltages more than the $n^{th}$ verification voltage. If, as a result of the determination at step 730, the $n^{th}$ target program cells are all determined not to have been programmed to have threshold voltages more than the $n^{th}$ verification voltage, the process returns to step 710 in which the program operation is repeatedly performed.

Next, a program operation is performed on second memory cells selected to store second data (hereinafter referred to as '$(n+1)^{th}$ target program cells'), from among the memory cells, such that the $(n+1)^{th}$ target program cells are programmed to have threshold voltages more than a second target voltage corresponding to the second data at step 740.

In more detail, the program operation is performed on the $(n+1)^{th}$ target program cells at step 740.

A detailed construction of the program operation is identical with that of step 710 except that the program operation is performed according to the first data stored in the first main register and the second data stored in the second main register. That is, the program operation is performed with consideration taken of both information about the $n^{th}$ target program cells and data of the $(n+1)^{th}$ target program cells.

In some embodiments of the present invention, when a program operation is performed on the $n^{th}$ target program cells, a bit line voltage can be slightly raised such that the amount of a shift in the threshold voltages of the $n^{th}$ target program cells resulting from the program operation can be reduced. Whether or not to raise the bit line voltage is determined based on the first and second data respectively stored in the first and second main registers. That is, a voltage level of the bit line is differently controlled according to a case in which target program data are stored only in the first main register or a case in which target program data are stored both in the first and second main registers.

After the program operation is performed, memory cells programmed to have a threshold voltage less than the $n^{th}$ verification voltage (i.e., the first target voltage), from among the $n^{th}$ the memory cells, are detected by performing an $n^{th}$ verification operation using an $n^{th}$ verification voltage. Next, memory cells programmed to have threshold voltages less than a second verification voltage (hereinafter referred to as a '$(n+1)^{th}$ verification voltage') (i.e., a second target voltage), from among the $(n+1)^{th}$ target program cells, are detected by performing a second verification operation using the second verification voltage (hereinafter referred to as an '(n+1)$^{th}$ verification operation').

In more detail, the first data stored in the first sub-register are transmitted to the first main register at step 750. That is, a result of the verification operation, stored in the first main register, is changed to an initial value (e.g., an input data value) prior to the verification operation. This operation can be called an operation for resetting the first main register.

This operation is performed in order to detect cells determined to have threshold voltages more than the n$^{th}$ verification voltage (i.e., under-programmed cells) even though they have not been programmed to have threshold voltages more than the n$^{th}$ verification voltage. In more detail, for example, in the case in which data of a low level to be programmed into memory cells are inputted to the first main register and if, as a result of a verification operation, the memory cells are determined to have been programmed with threshold voltages more than the n$^{th}$ verification voltage even though they have not been programmed more than the n$^{th}$ verification voltage, the data of a low level are changed into data of a high level. The data of a high level are changed into data of a low level again. Next, in an additional verification operation, data of under-programmed cells, from among the n$^{th}$ target program cells, maintain the data of a low level. According to the above method, memory cells normally programmed to have more than the n$^{th}$ verification voltage are set to data '0' (i.e., target program data), but are set to data '1' again in a subsequent verification operation. Accordingly, there is no problem.

To this end, the latch coupling unit 644 is driven, and so the data stored in the first sub-register are transmitted to the first register. Accordingly, in the case in which data '1' is outputted to the first node QB of the sub-latch unit 642 of the first sub-register, data '1' is also outputted to the first node Q of the data latch unit 634. Meanwhile, in the case in which data '0' is outputted to the first node QB of the sub-latch unit 642 of the first sub-register, data '1' is also outputted to the first node Q of the data latch unit 634. That is, the result of the verification operation stored in the data latch unit 634 is changed into the initial input data value again.

In summary, since data stored in the sub-latch unit 642 are transmitted to the data latch unit 634 again, memory cells determined to have been programmed with threshold voltages more than the n$^{th}$ verification voltage even though they have not been programmed more than the n$^{th}$ verification voltage (i.e., under-programmed cells) are set to a target program data.

After the target program data are set, the n$^{th}$ verification operation and the (n+1)$^{th}$ verification operation are performed on the (n+1)$^{th}$ target program cells by consecutively supplying the n$^{th}$ verification voltage PVn and the (n+1)$^{th}$ verification voltage PVn+1 at step 760.

That is, the n$^{th}$ verification operation is performed in order to determine whether all of the n$^{th}$ target program cells have been programmed to have threshold voltages more than the n$^{th}$ verification voltage. The (n+1)$^{th}$ verification operation is performed in order to determine whether all of the (n+1)$^{th}$ target program cells have been programmed to have threshold voltages more than the (n+1)$^{th}$ verification voltage (i.e., the second target voltage). A detailed verification operation is identical with that of step 720. If all of the n$^{th}$ target program cells have been programmed to have the threshold voltages more than the n$^{th}$ verification voltage, data '1' is outputted to the first node of the data latch unit of the first register. If all the (n+1)$^{th}$ target program cells have been programmed to have the threshold voltages more than the (n+1)$^{th}$ verification voltage, data '1' is outputted to the second node of the data latch unit of the second register.

A determination is then made as to whether all of the n$^{th}$ target program cells have been programmed to have threshold voltages more than the n$^{th}$ verification voltage based on data stored in the first main register and whether all of the (n+1)$^{th}$ target program cells have been programmed to have threshold voltages more than the (n+1)$^{th}$ verification voltage based on data stored in the second main register at step 770.

Information about the n$^{th}$ target program cells is stored in the data latch unit of the first main register. If data '1' is stored in the first node, it is determined that all the n$^{th}$ target program cells have been programmed to have threshold voltages more than the n$^{th}$ verification voltage. Furthermore, information about the (n+1)$^{th}$ target program cells is stored in the data latch unit of the second main register. If data '1' is stored in the first node, it is determined that all the (n+1)$^{th}$ target program cells have been programmed to have threshold voltages more than the (n+1)$^{th}$ verification voltage If, as a result of the determination, memory cells having threshold voltages less than the n$^{th}$ verification voltage, from among the n$^{th}$ target program cells, are detected, a program operation is performed on the corresponding memory cells such that the threshold voltages of the corresponding memory cells exceed the n$^{th}$ verification voltage. Furthermore, if, as a result of the determination, memory cells having threshold voltages less than the (n+1)$^{th}$ verification voltage, from among the (n+1)$^{th}$ target program cells, are detected, a program operation is performed on the corresponding memory cells such that the threshold voltages of the corresponding memory cells exceed the (n+1)$^{th}$ verification voltage.

Figure 8A:
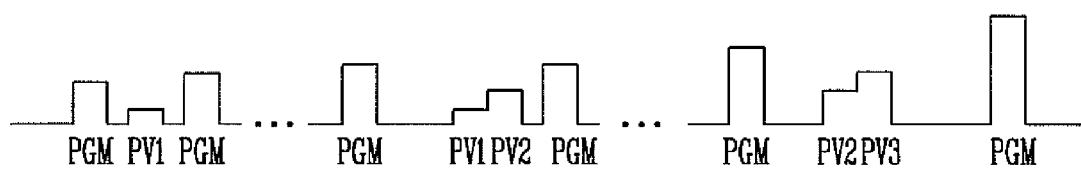
FIGS. 8A and 8B are diagrams illustrating a verification method in the nonvolatile memory device according to another embodiment of the present invention.
Figure 8B:
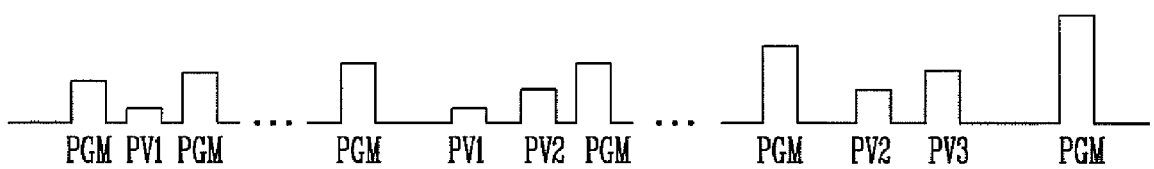

FIGS. 8A and 8B are diagrams illustrating a verification method in the nonvolatile memory device according to another embodiment of the present invention.

Referring to FIG. 8A, when a 2-bit MLC program operation is performed, a total of four distribution states, including an erase state, are required, and three verification voltages PV1, PV2, and PV3 are necessary. Furthermore, memory cells are classified into first target program cells to be programmed to have threshold voltages more than a first verification voltage PV1, second target program cells to be programmed to have threshold voltages more than a second verification voltage PV2, and third target program cells to be programmed to have threshold voltages more than a third verification voltage PV3. Here, a difference between the first verification voltage, the second verification voltage, and the third verification voltage may be changed according to a circuit designer, and preferably is in the range of 0.5 V to 1.0 V.

A program operation is performed on the first target program cells, and a first verification operation for the program operation is performed using the first verification voltage PV1. Next, the first verification operation and a second verification operation for the second target program cells are consecutively performed. Even if the program operation is determined to have been completed such that the first target program cells have threshold voltages more than the first verification voltage, as a result of the first verification operation, under-programmed cells may occur. Accordingly, the verification operations are repeatedly performed by setting data again.

Even after the second verification operation for the second target program cells is completed, the second verification operation for the second target program cells and a third verification operation for the third target program cells are repeatedly performed such that the threshold voltages of under-programmed cell that may occur can be raised by the program operation.

In FIG. 8A, the first verification voltage PV1 is applied during the first verification operation and then raised during the second verification operation. Accordingly, the first and second verification operations can be consecutively performed without delay.

However, as in FIG. 8B, the first verification voltage PV1 and the second verification voltage PV2 may be supplied with a certain time interval interposed therebetwen. In this case, during the time between the first and second verification operations, a precharge operation may be performed on a node (e.g., a sense node), having a voltage level lowered by the leakage current, in order to improve reliability of the operation.

As described above, the threshold voltages of under-programmed cells can be raised by performing a program operation on the under-programmed cells. Accordingly, a distribution of the threshold voltages of memory cells in each state can be narrowed because under-programmed cells are removed.

What is claimed is:

1. A method of programming a nonvolatile memory device, the method comprising:
    performing a first program operation on first memory cells selected to store first data, from among memory cells coupled to a selected word line, such that threshold voltages of the first memory cells are each driven to a first target voltage corresponding to the first data;
    performing a first verification operation on the first memory cells using a first verification voltage;
    performing a second program operation on second memory cells selected to store second data, from among the memory cells coupled to the selected word line, such that threshold voltages of the second memory cells are each driven to a second target voltage corresponding to the second data;
    detecting an under-programmed memory cell having a threshold voltage less than the first target voltage using the first verification voltage, from among the first memory cells, after performing the second program operation;
    performing a second verification operation for detecting a third memory cell having a threshold voltage less than the second target voltage using a second verification voltage, from among the second memory cells;
    performing a third program operation on the under-programmed memory cell such that the threshold voltage of the under-programmed memory cell becomes more than the first target voltage; and
    performing a fourth program operation on the third memory cell such that the threshold voltage of the third memory cell becomes more than the second target voltage.

2. The method of claim 1, further comprising:
    storing a result of the first verification operation upon a determination by the first verification operation that all of the first memory cells have been programmed with threshold voltages more than the first target voltage; and
    resetting the result of the first verification operation before performing the second verification operation.

3. The method of claim 2, further comprising:
    resetting the result of the first verification operation to a value corresponding to the first data stored in the first memory cells.

4. The method of claim 1, wherein a voltage level of the second verification is higher than that of the first verification voltage.

5. The method of claim 4, wherein in the second verification operation, the second verification voltage is supplied in a form of a pulse after the first verification voltage is supplied in a form of a pulse.

6. The method of claim 4, wherein in the second verification operation, a voltage level of the first verification voltage is raised up to a voltage level of the second verification voltage, after the first verification voltage has been supplied.

7. A method of programming a nonvolatile memory device, the method comprising:
    storing first data in a first main register and a first sub-register and storing second data in a second main register and a second sub-register, respectively;
    performing a first program operation and a first verification operation on first memory cells based on the first data stored in the first main register;
    storing a result of the first verification operation in the first main register;
    performing a second program operation on second memory cells based on the second data stored in the second main register;
    changing the result of the first verification operation, stored in the first main register, to the first data stored in the first sub-register;
    performing an additional verification operation on the first memory cells on which the first verification operation has been completed;
    storing a result of the additional verification operation in the first main register; and
    performing a second verification operation on the second memory cells.

8. The method of claim 7, further comprising:
    performing the first program operation again to raise a program voltage when threshold voltages of the first memory cells are determined to be less than a first verification voltage as a result of the first verification operation.

9. The method of claim 7, further comprising:
    consecutively performing the additional verification operation and the second verification operation after threshold voltages of the first memory cells are determined to be more than a first verification voltage as a result of the first verification operation.

10. The method of claim 7, further comprising:
    performing the additional verification operation after the second program operation has been performed.

11. The method of claim 7, further comprising:
    performing the first program operation on the first memory cells again when threshold voltages of the first memory cells are determined to be less than a first verification voltage as a result of the additional verification operation.

12. The method of claim 7, wherein:
    during the additional verification operation, a first verification voltage is supplied to the first memory cells, and
    during the second verification operation, a second verification voltage greater than the first verification voltage is supplied to the second memory cells.

13. The method of claim 7, wherein:
    during the additional verification operation, a first verification voltage is supplied to the first memory cells, and
    during the second verification operation, a second verification voltage higher than the first verification voltage is supplied to the second memory cells after the supply of the first verification voltage stops.

14. The method of claim 7, further comprising:
performing the second program operation again to raise a program voltage when threshold voltages of the second memory cells are determined to be less than a second verification voltage as a result of the second verification operation.

15. A nonvolatile memory device, comprising:
main registers each configured to store input data before a program operation and to store a result of a verification operation instead of the input data upon the verification operation being performed;
sub-latch units each configured to store the input data during the program operation and the verification operation; and
latch coupling units each configured to transfer the input data, stored in a respective one of the sub-latch units, to a respective one of the main registers when threshold voltages of memory cells are determined to be greater than a target voltage as a result of the verification operation.

16. The nonvolatile memory device of claim 15, wherein the latch coupling units each prevents the result of the verification operation from being transferred to the respective sub-latch unit such that the respective sub-latch unit maintains the input data during the verification operation.

17. The nonvolatile memory device of claim 15, further comprising:
latch reset units each configured to reset the respective sub-latch unit.

18. The nonvolatile memory device of claim 15, wherein in operating each of the latch coupling units, data having a same logic level are stored in the respective main register and the respective sub-latch unit when data is inputted.

* * * * *